United States Patent
Tsai (10) Patent No.: US 10,044,361 B1
(45) Date of Patent: Aug. 7, 2018

(54) AMPLIFYING CIRCUIT, ANALOG TO DIGITAL CONVERTER WITH MULTI-STAGE CONVERSION RANGE AND RELATED CONVERSION METHOD

(71) Applicant: Wistron Corporation, New Taipei (TW)

(72) Inventor: Meng-Ru Tsai, New Taipei (TW)

(73) Assignee: Winstron Corporation, New Taipei (TW)

( * ) Notice: Subject to any disclaimer, the term of this patent is extended or adjusted under 35 U.S.C. 154(b) by 0 days.

(21) Appl. No.: 15/867,664

(22) Filed: Jan. 10, 2018

(30) Foreign Application Priority Data

Oct. 2, 2017 (TW) .............................. 106134060 A (51) Int. Cl.
| | | |
|---|---|---|
| *H03M 1/06* | (2006.01) | |
| *H03M 1/08* | (2006.01) | |
| *H03F 3/45* | (2006.01) | |
| *H03K 19/20* | (2006.01) | |
| *H03K 5/24* | (2006.01) | |

(52) U.S. Cl.
CPC ............ *H03M 1/0854* (2013.01); *H03F 3/45* (2013.01); *H03K 5/24* (2013.01); *H03K 19/20* (2013.01)

(58) Field of Classification Search
CPC ........ H03M 1/18; H03M 1/182; H03M 1/183; H03M 1/185; H03M 1/186; H03M 1/0854; H03F 3/45; H03K 5/24; H03K 19/20
USPC .......................................... 341/118, 139, 141
See application file for complete search history.

(56) References Cited

U.S. PATENT DOCUMENTS

| | | | | |
|---|---|---|---|---|
| 4,990,913 A * | 2/1991 | Beauducel | .............. | H03M 1/00 341/138 |
| 5,343,200 A * | 8/1994 | Matsui | .................. | H03M 1/187 341/139 |
| 6,621,430 B2 * | 9/2003 | Mestdagh | ............. | H03M 1/188 341/118 |
| 7,295,073 B2 * | 11/2007 | Hsieh | ..................... | H03G 3/001 330/129 |
| 7,541,956 B1 * | 6/2009 | Lee | ........................ | H03M 1/164 341/139 |
| 7,965,208 B2 * | 6/2011 | McLoughlin | ......... | H03M 1/183 330/9 |
| 8,890,727 B1 | 11/2014 | da Silva | | |
| 9,515,672 B2 * | 12/2016 | Zhang | .................... | H03M 1/186 |
| 2010/0085231 A1 | 4/2010 | Doris | | |

* cited by examiner

*Primary Examiner* — Khai M Nguyen
(74) *Attorney, Agent, or Firm* — Winston Hsu (57) ABSTRACT

An amplifying circuit for analog to digital converter with multi-stage conversion range is used for dividing an analog input voltage into multiple voltage ranges to perform signal amplification and attenuation according to multiple magnifications (e.g., amplify the analog input voltage with low voltage level, and attenuate the analog input voltage with high voltage level). The analog to digital converter performs analog to digital conversion to the analog input voltage with amplification or attenuation to generate a digital bit with amplification or attenuation, and then generates an output digital bit according to the digital bit and the magnification. As a result, the analog to digital converter is adaptive to the analog input voltage with high voltage level, and precision and quantization error of the analog input voltage with low voltage level can be maintained as well.

17 Claims, 6 Drawing Sheets

AMPLIFYING CIRCUIT, ANALOG TO DIGITAL CONVERTER WITH MULTI-STAGE CONVERSION RANGE AND RELATED CONVERSION METHOD

BACKGROUND OF THE INVENTION

1. Field of the Invention

The present invention relates to an amplifying circuit, analog to digital converter with multi-stage conversion range and related conversion method, and more particularly, to an amplifying circuit, analog to digital converter with multi-stage conversion range and related conversion method adaptive to the analog input voltage with high voltage level, and maintain precision and quantization error of the analog input voltage with low voltage level.

2. Description of the Prior Art

Analog-to-Digital Converter (ADC) is widely used in microcontrollers, however, applicant notices two major problems in the circuit design and application of the analog-to-digital converter.

First, an input source signal must be attenuated before it is inputted to the analog to digital converter when a maximum voltage level of the input source signal is greater than a maximum allowable input voltage level of the analog to digital converter. However, when an input source signal with low voltage level (e.g., a small signal with voltage level 0 to 1 Volt) is inputted to the analog to digital converter, a quantization error of a digital output signal corresponding to the small signal appears to be greater than a quantization error of a digital output signal corresponding to an input signal without attenuation, which results low precision to the small signal.

Second, some specific applications require high precision for the small signal with low level range; however, the analog to digital converter adaptive to high level range cannot meet the requirement for the quantization error (or, precision) of the low level range. In particular using a design of uniform quantization error, the quantization error increases if the voltage level of the input source becomes smaller, thereby the precision of the small signal decreases.

Therefore, there is a need to provide an analog to digital converter adaptive to the input voltage with high level range and precision and quantization error of the input voltage with low voltage level can be maintained as well.

SUMMARY OF THE INVENTION

It is therefore an objective of the present invention to provide an amplifying circuit, analog to digital converter with multi-stage conversion range and related conversion method adaptive to the analog input voltage with high voltage level, and maintain precision and quantization error of the analog input voltage with low voltage level.

The present invention discloses an amplifying circuit for analog to digital converter with multi-stage conversion ranges includes a first comparator, a first operational amplifier, a first switch, a NOR Gate, a second operational amplifier, a second switch, a second comparator, a third operational amplifier, and a third switch. The first comparator is configured to output a first control signal according to a first threshold voltage and an analog input signal. The first operational amplifier is configured to amplify the analog input signal according to a first magnification to generate a first amplified analog input signal. The first switch is coupled to the first comparator and the first operational amplifier, and configured to control whether to output the first amplified analog input signal according to the first control signal, wherein the first switch control outputs the first amplified analog input signal when the analog input signal is substantially smaller than the first threshold voltage. The NOR Gate is configured to generate a second control signal according to the first control signal and a third control signal. The second operational amplifier is configured to amplify the analog input signal according to a second magnification to generate a second amplified analog input signal. The second switch is coupled to the NOR Gate and the second operational amplifier, and configured to control whether to output the second amplified analog input signal according to the second control signal, wherein the first switch control outputs the second amplified analog input signal when the analog input signal is substantially greater than the first threshold voltage and smaller than a second threshold voltage. The second comparator is configured to output the third control signal according to the second threshold voltage and the analog input signal. The third operational amplifier is configured to amplify the analog input signal according to a third magnification to generate a third amplified analog input signal. The third switch is coupled to the second comparator and the third operational amplifier, and configured to control whether to output the third amplified analog input signal according to the third control signal, wherein the third switch controls outputting the third amplified analog input signal when the analog input signal is substantially greater than the second threshold voltage.

The present invention further discloses an analog to digital converter with multi-stage conversion ranges includes the amplifying circuit as above mentioned and a microcontroller. The microcontroller is coupled to the amplifying circuit, and configured to perform analog to digital conversion to one of the first amplified analog input signal, the second amplified analog input signal and the third amplified analog input signal to generate an amplified digital code, and generate a digital output code according to the amplified digital code and one of the first magnification corresponding to the first control signal, the second magnification corresponding to the second control signal and the third magnification corresponding to the third control signal.

The present invention further discloses a method of analog to digital conversion, for an analog to digital converter with multi-stage conversion ranges, and includes determining a magnification according to a plurality of control signals; amplifying an analog input signal according to the magnification to generate an amplified analog input signal; performing analog to digital conversion to the amplified analog input signal to generate an amplified digital code; and generating an output digital code according to a reciprocal of the magnification and the amplified digital code.

The present invention divides the analog input voltage into multiple voltage level ranges, respectively performs signal amplification and attenuation based on different magnifications, and computes the digital codes corresponding to the analog input voltage according to the magnifications. As a result, the analog to digital converter is adaptive to the analog input voltage with high voltage level, and precision and quantization error of the analog input voltage with low voltage level can be maintained as well.

These and other objectives of the present invention will no doubt become obvious to those of ordinary skill in the art

DETAILED DESCRIPTION

Figure 1:
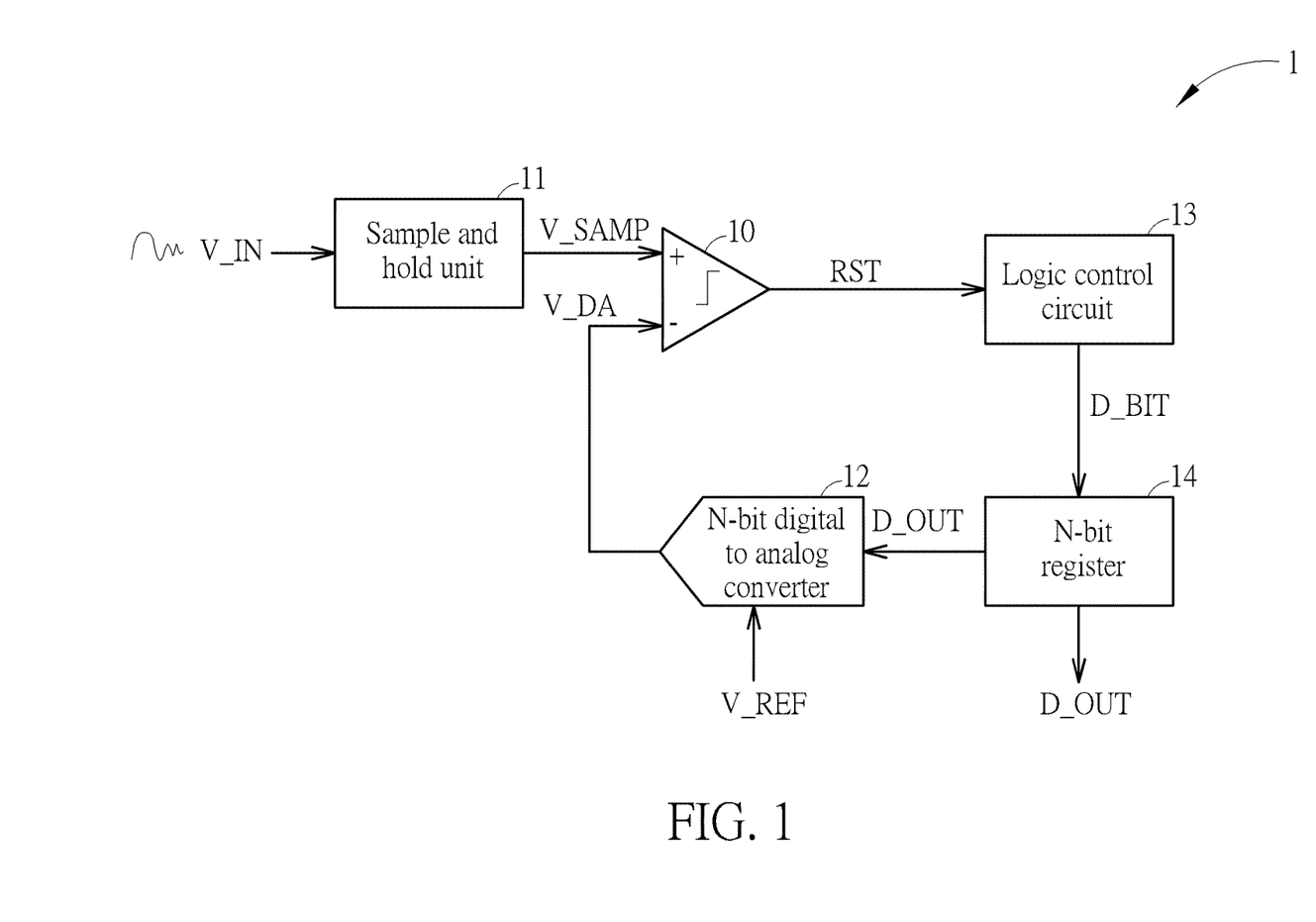
FIG. 1 is a functional block diagram of an analog to digital converter.

FIG. 1 is a functional block diagram of an analog-to-digital Converter, (ADC) 1. The analog to digital converter 1 is configured to convert an analog input signal V_IN into a digital output signal D_OUT, and includes a comparator 10, a sample and hold unit 11, an N-bit digital to analog converter (Digital-to-Analog Converter, DAC) 12, a logic control circuit 13 and an N-bit register 14.

The sample and hold unit 11 is coupled to comparator 10, and configured to perform sampling to the analog input signal V_IN to generate a sampled signal V_SAMP to the comparator 10. The comparator 10 is coupled to the sample and hold unit 11, the digital to analog converter 12 and the logic control circuit 13, and includes a positive input terminal, a negative input terminal and an output terminal. The comparator 10 is configured to compare the sampled signal V_SAMP with a reference analog voltage V_DA to generate a comparison result RST to the logic control circuit 13. The logic control circuit 13 is coupled to the comparator 10 and the N-bit register 14, and configured to generate bit data D_BIT to the N-bit register 14 according to the comparison result RST. The N-bit register 14 is coupled to the digital to analog converter 12 and the logic control circuit 13, and configured to generate the digital output signal D_OUT to the digital to analog converter 12 according to the bit data D_BIT, and output the digital output signal D_OUT. The digital to analog converter 12 is coupled to the comparator 10 and the N-bit register 14, and configured to convert the digital output signal D_OUT into the reference analog voltage V_DA according to a reference voltage V_REF to output the reference analog voltage V_DA to the negative input terminal of the comparator 10.

Given that the analog input signal V_IN is an analog small signal with a voltage level 0-1 Volt, and the analog to digital converter 1 is an eight-bit converter (i.e., N=8 bits). In operation, the comparator 10 compares the sampled signal V_SAMP with the reference analog voltage V_DA to generate the comparison result RST with a high voltage level when the sampled signal V_SAMP is greater than reference analog voltage V_DA, so the bit data D_BIT generated by the logic control circuit 13 is logic "1". On the other hand, the comparator 10 generates the comparison result RST with a low voltage level when sampled signal V_SAMP is smaller than the reference analog voltage V_DA, so the bit data D_BIT generated by the logic control circuit 13 is logic "0".

Then, the N-bit register 14 stores and output the bit data D_BIT to the digital to analog converter 12, and the digital to analog converter 12 converts the bit data D_BIT into the discrete reference analog voltage V_DA to perform the next bit conversion cycle. Like wisely, once the analog to digital converter 1 has finished N-bit conversion cycle, the N-bit register 14 outputs the digital output signal D_OUT with paralleled N-bit to obtain the digital output code corresponding to the analog input signal V_IN.

Figure 2:
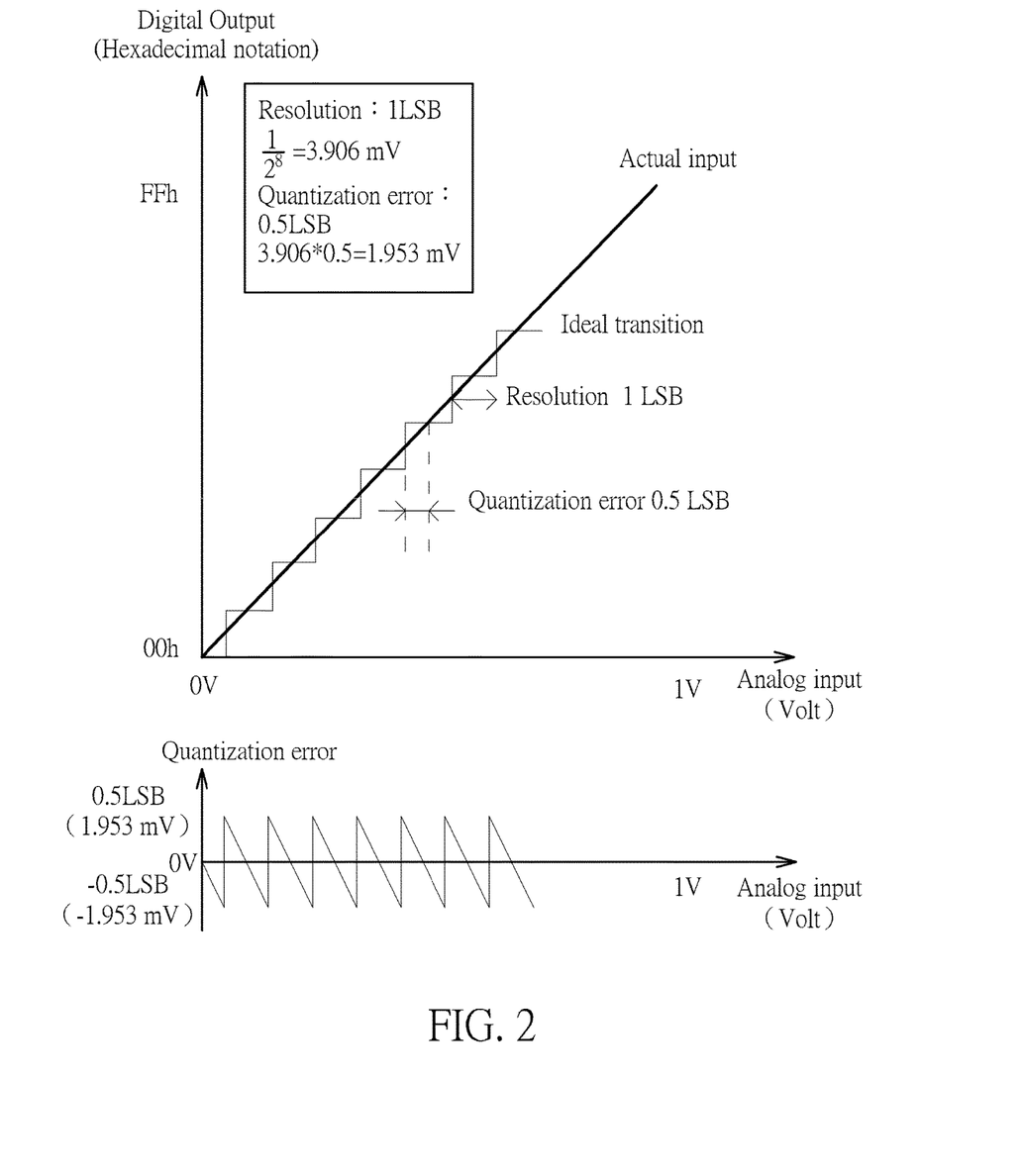
FIG. 2 illustrates a resolution curve and quantization error curve of an analog input signal with 0-1 volt.
Figure 3:
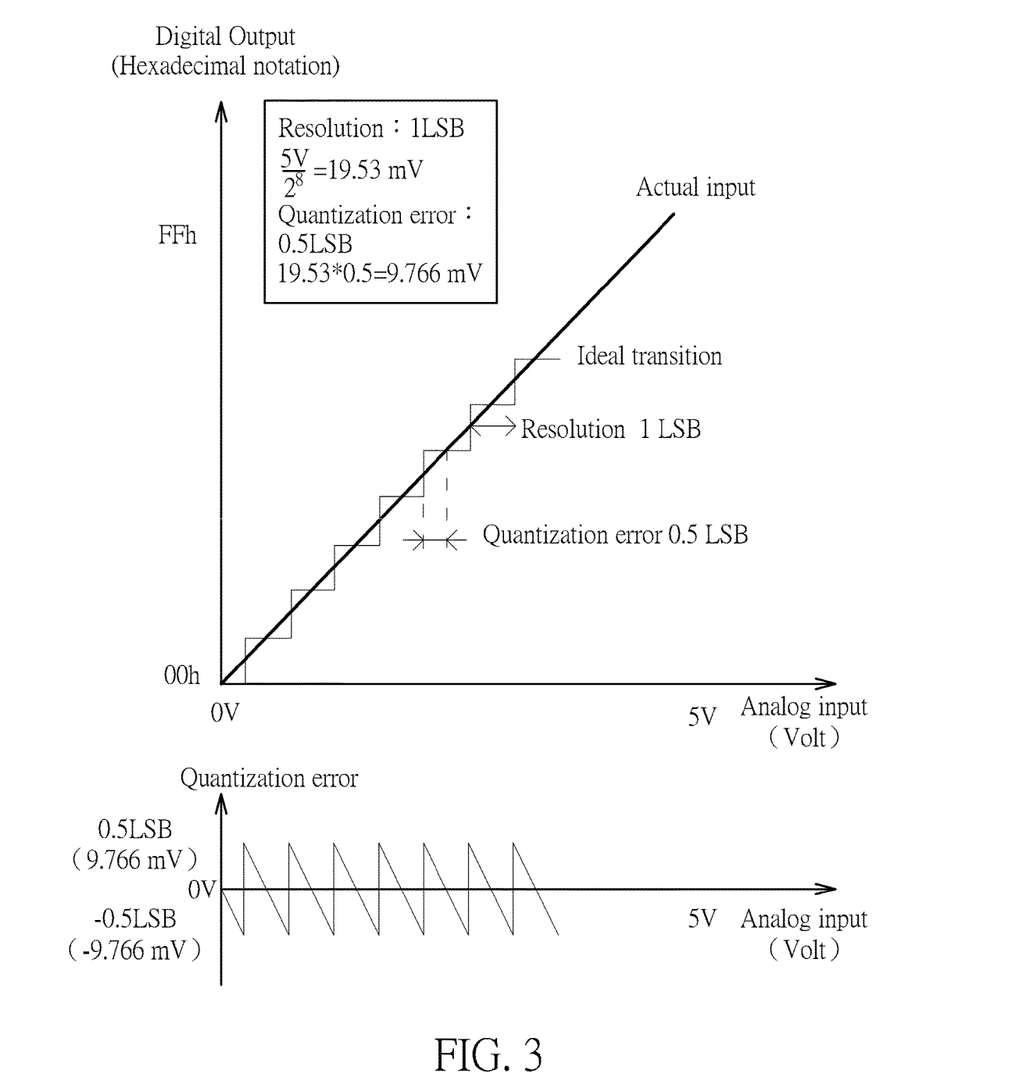
FIG. 3 illustrates a conversion curve and a quantization error curve of an analog input signal with 0-5 volts.

FIG. 2 illustrates a resolution curve and quantization error curve of an analog input signal with 0-1 volt, FIG. 3 illustrates a conversion curve and a quantization error curve of an analog input signal with 0-5 volts. A real input voltage (e.g., the analog input signal V_IN) is denoted with a thick solid line, and an ideal transition voltage (e.g., the reference analog voltage V_DA) is denoted with a thin solid line. Given that the conversion bit number N is eight bits, and there are 256 (2^8) conversion digital codes. In ideal, the analog to digital converter 1 uniformly divides the reference voltage V_REF into 256 steps, each of the steps has the same voltage level range, wherein a resolution of each step is one LSB (least significant bit) and an averaged quantization error of each step is 0.5 LSB.

Table 1 illustrates resolution and averaged quantization error for analog input signals with voltage level 0-1 volt and 0-5 volts. As can be seen from Table 1, the voltage level of the analog input signal is positively proportional to the averaged quantization error. The averaged quantization error increases when the voltage level of the analog input signal increases. On the other hand, the averaged quantization error decreases when the voltage level of the analog input signal decreases.

TABLE 1

| voltage level | resolution (1 LSB) | averaged quantization error (0.5 LSB) |
|---|---|---|
| 0-1 Volt | 1 Volt/256 = 3.906 millivolts | 3.906 * 0.5 = 1.953 millivolts |
| 0-5 Volts | 5 Volts/256 = 19.53 millivolts | 19.53 * 0.5 = 9.766 millivolts |

Further, an error rate is a ratio of the averaged quantization error and the input voltage. In FIG. 2, the error rate is 9.75% (1.95 millivolts/20 millivolts=9.75%) if the voltage level of the analog input signal is 20 millivolts. In addition, the error rate is 0.205% (1.95 millivolts/950 millivolts=0.205%) if the voltage level of the analog input signal is 950 millivolts. As can be seen, the voltage level of the analog input signal is negatively proportional to the error rate. The error rate increases when the voltage level of the analog input signal decreases. On the other hand, the error rate decreases when the voltage level of the analog input signal increases.

When the voltage level of the analog input signal is greater than the conversion range of the analog to digital converter, the analog input signal must be attenuated before it is inputted to the analog to digital converter. In such a situation, since the voltage level of the analog input signal is attenuated, the error rate of the analog input signal is amplified. For example, given that the voltage level of the analog input signal V_IN is 0-5 Volts and the conversion range of the analog to digital converter 1 is 0-1 Volt, the analog input signal is attenuated by 1/5 times to be inputted to the analog to digital converter 1. In such a situation, the error rate is amplified by 5 times when the analog input signal is attenuated by 1/5 times. Moreover, if there is noise mixed with the analog input signal to cause signal deformation of the analog signal with voltage level 0-1 Volt, it may not meet the requirement of high precision (i.e., low error rate).

Figure 4:
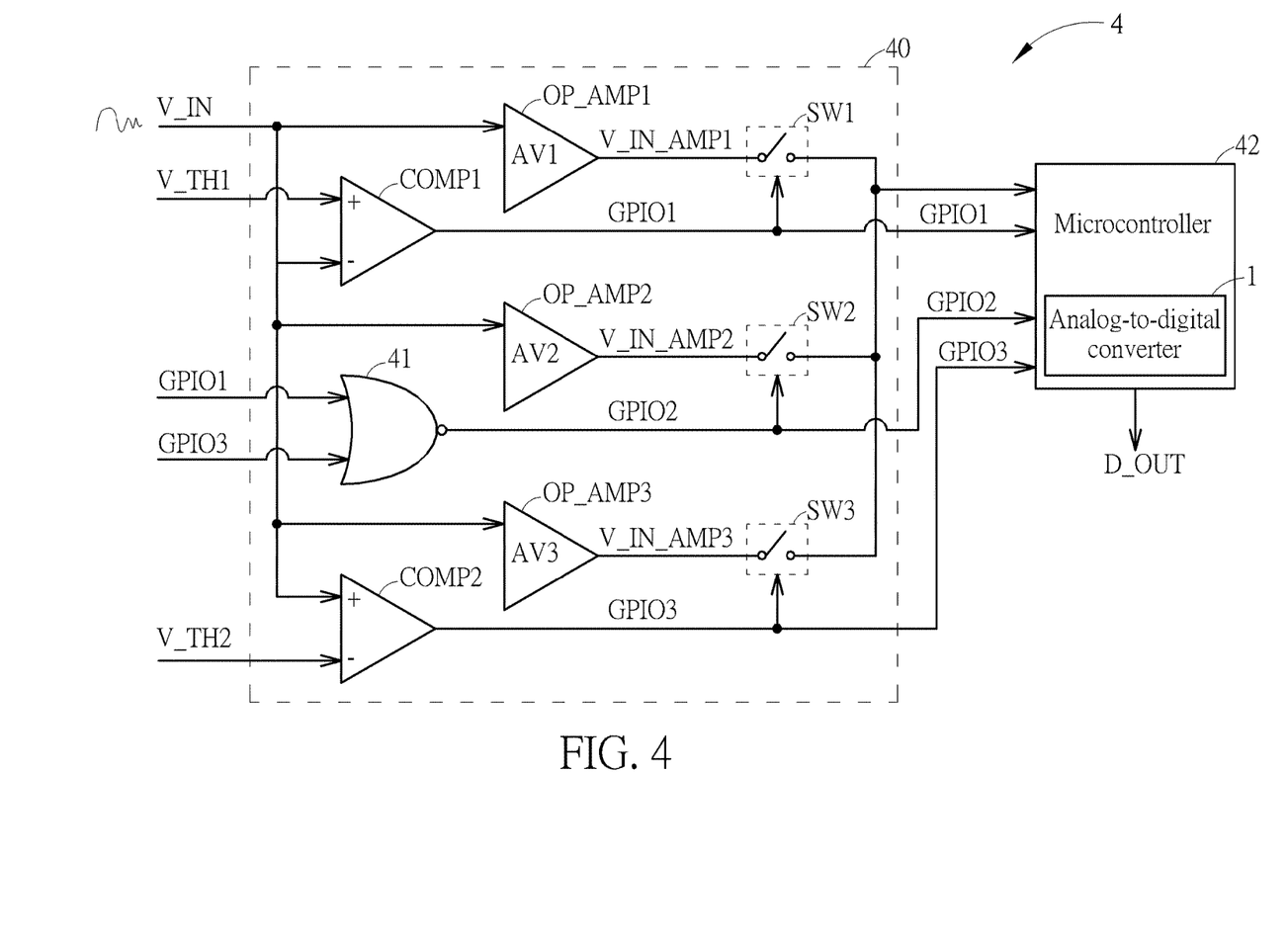
FIG. 4 is a functional block diagram of an analog to digital converter according to an embodiment of the present invention.

FIG. 4 is a functional block diagram of an analog to digital converter 4 with multi-stage conversion range 4 according to an embodiment of the present invention. The analog to digital converter 4 includes an amplifying circuit 40 and a microcontroller 42. In this embodiment, the microcontroller 42 is built-in with the analog to digital converter 1 to perform analog to digital conversion to the analog input signal V_IN to generate a digital output signal D_OUT.

The amplifying circuit 40 is coupled to microcontroller 42, and configured to perform signal simplification (or attenuation) to the analog input signal V_IN and generate control signals GPIO1, GPIO2 and GPIO3 according to different voltage level ranges and corresponding magnifications to output the amplified analog input signal V_IN and the control signals GPIO1, GPIO2 and GPIO3 to the microcontroller 42. The microcontroller 42 performs analog to digital conversion to the amplified (or attenuated) analog input signal V_IN, and then recovers the analog input signal V_IN according to the control signals GPIO1, GPIO2 and GPIO3 to generate the digital code corresponding to the analog input signal V_IN. The amplifying circuit 40 includes operational amplifiers OP_AMP1, OP_AMP2 and OP_AMP3, comparators COM1 and COM2, switches SW1, SW2 and SW3 and a NOR Gate 41.

The comparator COM1 includes a positive input terminal, a negative input terminal and an output terminal. The positive input terminal receives a threshold voltage V_TH1, the negative input terminal receives an analog input signal V_IN, and the output terminal receives an output control signal GPIO1. The comparator COM1 is coupled to the switch SW1, and configured to compare the analog input signal V_IN with the threshold voltage V_TH1 to output the control signal GPIO1 to the switch SW1. The operational amplifier OP_AMP1 is configured to amplify the analog input signal V_IN according to a magnification AV1 to generate an analog input signal V_IN_AMP1, wherein the magnification AV1 is substantially greater than 1. The switch SW1 is coupled to the comparator COM1, the operational amplifier OP_AMP1 and the microcontroller 42, and configured to connect the operational amplifier OP_AMP1 with the microcontroller 42 or disconnect the operational amplifier OP_AMP1 from the microcontroller 42 according to the control signal GPIO1, so as to control whether to input the analog input signal V_IN_AMP1 to the microcontroller 42.

The NOR Gate 41 includes a first input terminal, a second input terminal and an output terminal. The first input terminal receives the control signal GPIO1, the second input terminal receives the control signal GPIO3, and the output terminal outputs the control signal GPIO2. The NOR Gate 41 is coupled to the switch SW2, and configured to output the control signal GPIO2 to the switch SW2 according to the control signals GPIO1 and GPIO3. The operational amplifier OP_AMP2 is configured to amplify the analog input signal V_IN according to a magnification AV2 to generate an analog input signal V_IN_AMP2, wherein the magnification AV2 is substantially equal to 1. The switch SW2 is coupled to the NOR Gate 41, the operational amplifier OP_AMP2 and the microcontroller 42, and configured to connect the operational amplifier OP_AMP2 with the microcontroller 42 or disconnect the operational amplifier OP_AMP2 from the microcontroller 42 according to the control signal GPIO2, so as to control whether to input the analog input signal V_IN_AMP2 to the microcontroller 42.

The comparator COM3 includes a positive input terminal, a negative input terminal and an output terminal. The positive input terminal receives the analog input signal V_IN, the negative input terminal receives a threshold voltage V_TH2, and the output terminal outputs the control signal GPIO3. The comparator COM3 is coupled to the switch SW3, and configured to compare the analog input signal V_IN with the threshold voltage V_TH2 to output the control signal GPIO3 to the switch SW3. The operational amplifier OP_AMP3 is configured to amplify the analog input signal V_IN according to a magnification AV3 to generate an analog input signal V_IN_AMP3, wherein the magnification AV3 is substantially smaller than 1. The switch SW3 is coupled to the comparator COM3, the operational amplifier OP_AMP3 and the microcontroller 42, and configured to connect the operational amplifier OP_AMP3 with microcontroller 42 or disconnect the operational amplifier OP_AMP3 from the microcontroller 42 according to the control signal GPIO3, so as to control whether to input the analog input signal V_IN_AMP3 to the microcontroller 42.

Under the above mentioned structure, the present invention divides the analog input voltage into multiple voltage level ranges, and respectively performs signal amplification and attenuation based on different magnifications.

In detail, when the voltage level of the analog input signal V_IN is substantially smaller than threshold voltage V_TH1 (V_IN<V_TH1), the operational amplifier OP_AMP1 amplifies the analog input signal V_IN (by the magnification AV1>1) to generate the analog input signal V_IN_AMP1, and the control signal GPIO1 generated by the comparator COM1 is logic "1". When the control signal GPIO1 is logic "1", the switch SW1 connects the operational amplifier OP_AMP1 and the microcontroller 42 to input the analog input signal V_IN_AMP1 to the microcontroller 42; while the microcontroller 42 performs analog to digital conversion to the analog input signal V_IN_AMP1, and then convert the digital code corresponding to the analog input signal V_IN_AMP1 into the digital code corresponding to the analog input signal V_IN according to the reciprocal (1/AV1) of the magnification AV1. On the other hand, when the voltage level of the analog input signal V_IN is substantially greater than the threshold voltage V_TH1 (V_IN>V_TH1), the control signal GPIO1 generated by the comparator COM1 is logic "0". When the control signal GPIO1 is logic "0", the switch SW1 disconnect the operational amplifier OP_AMP1 from the microcontroller 42 to not input the analog input signal V_IN_AMP1 to the microcontroller 42, and thus the microcontroller 42 cannot perform analog to digital conversion to the analog input signal V_IN_AMP1.

When the voltage level of the analog input signal V_IN is substantially greater than the threshold voltage V_TH2 (V_IN>V_TH2), the operational amplifier OP_AMP3 attenuates the analog input signal V_IN (magnification AV3<1) to generate the analog input signal V_IN_AMP3, and the control signal GPIO3 generated by the comparator COM2 is logic "1". When the control signal GPIO3 is logic "1", the switch SW3 connects the operational amplifier OP_AMP3 and the microcontroller 42 to input the analog input signal V_IN_AMP3 to the microcontroller 42; while the microcontroller 42 performs analog to digital conversion to the analog input signal V_IN_AMP3, and then convert the digital code corresponding to the analog input signal V_IN_AMP3 into the digital code corresponding to the analog input signal V_IN according to the reciprocal (1/AV3) of the magnification AV3. On the other hand, When voltage level of the analog input signal V_IN is substantially smaller than the threshold voltage V_TH2 (V_IN<V_TH2), the control signal GPIO3 generated by the comparator COM2 is logic "0". When the control signal GPIO3 is logic "0", the switch SW3 disconnects the operational amplifier OP_AMP3 from the microcontroller 42 to not input the analog input signal V_IN_AMP3 to the microcontroller 42, and thus the microcontroller 42 cannot perform analog to digital conversion to the analog input signal V_IN_AMP3.

When the voltage level of the analog input signal V_IN is substantially greater than the threshold voltage V_TH1 and smaller than the threshold voltage V_TH2 (V_TH1<V_IN<V_TH2), the operational amplifier OP_AMP2 maintains the analog input signal V_IN (magnification AV2=1) with the same to generate the analog input signal V_IN_AMP2, and the control signal GPIO2 generated by the NOR Gate 41 is logic "1", wherein both the control signals GPIO1 and GPIO3 are logic "0". When the control signal GPIO2 is logic "1", the switch SW2 connects the operational amplifier OP_AMP2 and the microcontroller 42 to input the analog input signal V_IN_AMP2 to the microcontroller 42; while the microcontroller 42 performs analog to digital conversion to the analog input signal V_IN_AMP2, and then convert the digital code corresponding to the analog input signal V_IN_AMP2 to the digital code corresponding to the analog input signal V_IN according to the reciprocal (1/AV2) of the magnification AV2. On the other hand, when the control signal GPIO2 is logic "0", the switch SW2 disconnects the operational amplifier OP_AMP2 from the microcontroller 42 to not input the analog input signal V_IN_AMP2 to the microcontroller 42, and thus the microcontroller 42 cannot perform analog to digital conversion to the analog input signal V_IN_AMP2.

As a result, the present invention divides the analog input voltage V_IN into multiple voltage level ranges (e.g., 0-VTH_1, V_TH1-V_TH2, V_TH2-V_MAX, wherein the V_MAX is a maximum voltage), and respectively performs signal amplification and attenuation based on different magnifications (e.g., AV1>1, AV2=1, AV3<1) to ensure the precision and quantization error of the input signal within low level range.

Figure 5:
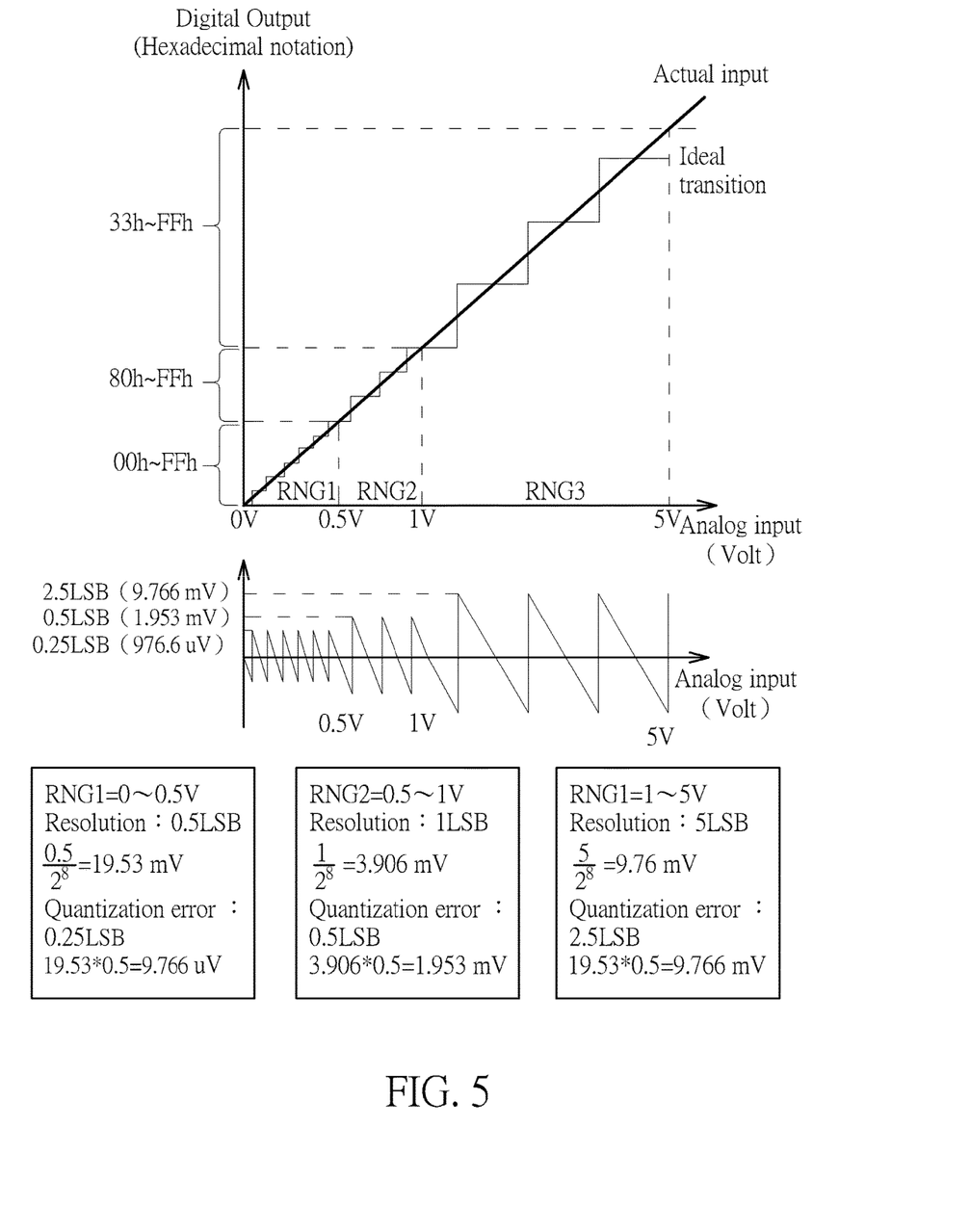
FIG. 5 illustrates a resolution curve and quantization error curve of the analog to digital converter in FIG. 4 according to an embodiment of the present invention.

FIG. 5 illustrates a resolution curve and quantization error curve of the analog to digital converter 40, wherein a real input voltage (e.g., the analog input signal V_IN) is denoted with a thick solid line and an ideal transition voltage is denoted with a thin solid line. In this embodiment, given that the voltage level of the analog input signal V_IN is 0-5 volts, and a conversion range of the analog to digital converter built in the microcontroller 42 is 0-1.2 volts, which is not limited. Given that the threshold voltage V_TH1 is substantially 0.5 volts, the threshold voltage V_TH2 is substantially 1 volt, which is not limited. The magnification AV1 corresponds to a voltage level range RNG1 (e.g., 0-0.5 volts), the magnification AV2 corresponds to a voltage level range RNG2 (e.g., 0.5-1 volts), and magnification AV3 corresponds to a voltage level range RNG3 (e.g., 1-5 volts), which is not limited.

Take an 8-bit analog to digital conversion for example, Table 2 describes voltage level range/digital output range (hexadecimal notation), resolution and averaged quantization error corresponding to the analog input signal with voltage level 0-5 volts.

TABLE 2

| voltage level range/digital output range | resolution | averaged quantization error |
|---|---|---|
| RNG1 = 0-0.5 volts/ 00h-FFh | 0.5 LSB: 1 volt/256 * 0.5 = 1.953 millivolts | 0.25 LSB: 1.953 * 0.5 = 976.6 microvolts |
| RNG2 = 0.5-1 volts/ 80h-FFh | 1 LSB: 1 volt/256 * 1 = 3.906 millivolts | 1 LSB: 3.906 * 0.5 = 1.953 millivolts |
| RNG3 = 1-5 volts/ 33h-FFh | 5 LSB: 1 volt/256 * 5 = 19.53 millivolts | 2.5 LSB: 19.53 * 0.5 = 9.765 millivolts |

Compare with Table 1 and Table 2, the averaged quantization error corresponding to the voltage level range 0-0.5 volts decreases from 1.953 millivolts to 976.6 microvolts, the averaged quantization error corresponding to the voltage level range 0.5-1 is the same 1.953 millivolts, and the averaged quantization error corresponding to the voltage level range 1-5 volts is the same 9.765 millivolts, which means that the averaged quantization error corresponding to low level range is decreased and improved. In addition, the error rate is a ratio of the averaged quantization error and the input voltage, the error rate decreases when the averaged quantization error decreases to equivalently increase the precision. As a result, the analog to digital converter 40 of the present invention is adaptive to the analog input voltage with high voltage level, and precision and quantization error of the analog input voltage with low voltage level can be maintained as well.

Figure 6:
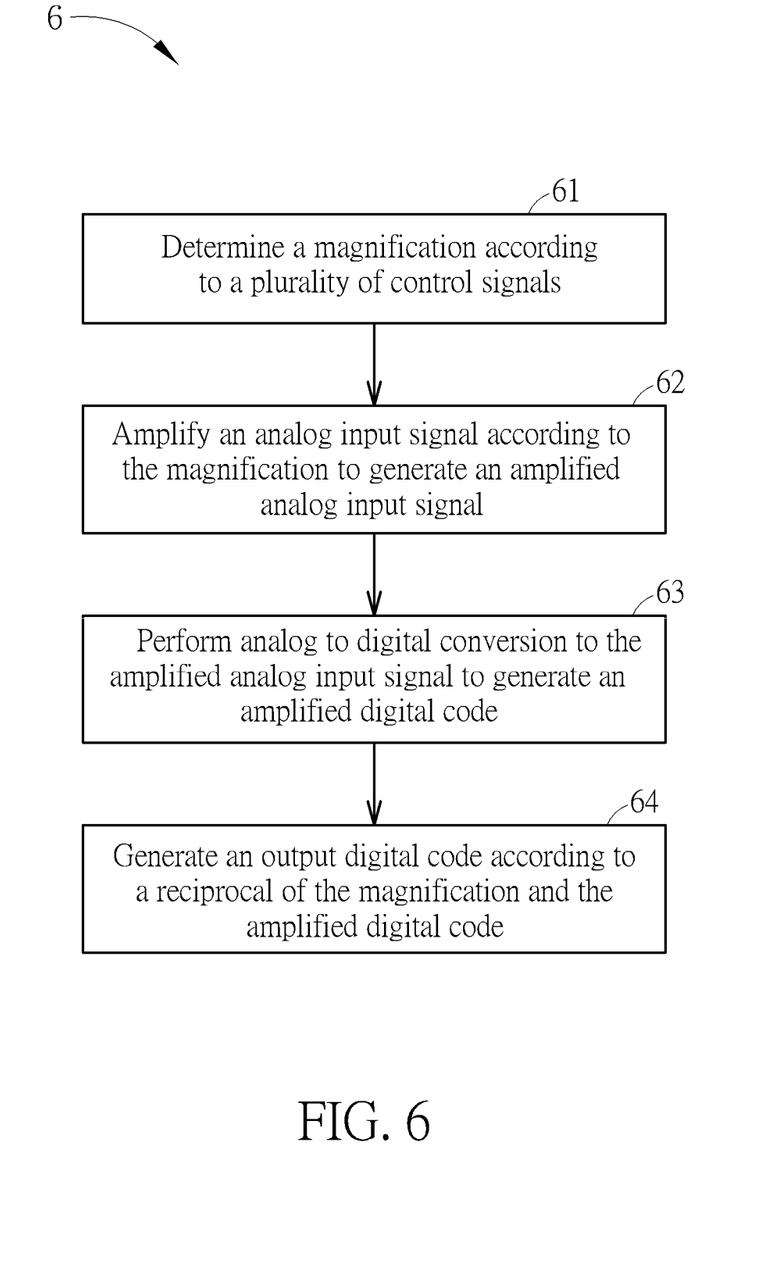
FIG. 6 is a flowchart of a process of an analog to digital conversion according to an embodiment of the present invention.

Operations of the analog to digital converter 40 may be summarized into an analog to digital conversion process 6, as shown in FIG. 6. The analog to digital conversion process 6 may be compiled into a program code and stored in the microcontroller 42 or a built-in memory of the microcontroller 42 for instructing the microcontroller 42 to perform signal amplification (or attenuation) and analog to digital conversion to the analog input signal, and then generate the corresponding digital code. The analog to digital conversion process 6 includes the following steps.

Step 61: Determine a magnification according to a plurality of control signals.

Step 62: Amplify an analog input signal according to the magnification to generate an amplified analog input signal.

Step 63: Perform analog to digital conversion to the amplified analog input signal to generate an amplified digital code.

Step 64: Generate an output digital code according to a reciprocal of the magnification and the amplified digital code.

Detailed descriptions of the analog to digital conversion process 6 may be obtained by referring to descriptions of the analog to digital converter 40, which is omitted.

To sum up, the present invention divides the analog input voltage into multiple voltage level ranges, respectively performs signal amplification and attenuation based on different magnifications, and computes the digital codes corresponding to the analog input voltage according to the magnifications. As a result, the analog to digital converter is adaptive to the analog input voltage with high voltage level, and precision and quantization error of the analog input voltage with low voltage level can be maintained as well.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. An amplifying circuit for analog to digital converter with multi-stage conversion ranges, comprising:
   a first comparator, configured to output a first control signal according to a first threshold voltage and an analog input signal;
   a first operational amplifier, configured to amplify the analog input signal according to a first magnification to generate a first amplified analog input signal when the analog input signal is smaller than the first threshold voltage;
   a first switch, coupled to the first comparator and the first operational amplifier, and configured to control whether to output the first amplified analog input signal according to the first control signal, wherein the first switch control outputs the first amplified analog input signal when the analog input signal is substantially smaller than the first threshold voltage;
   a NOR Gate, configured to generate a second control signal according to the first control signal and a third control signal;
   a second operational amplifier, configured to amplify the analog input signal according to a second magnification to generate a second amplified analog input signal when the analog input signal is greater than the second threshold voltage;
   a second switch, coupled to the NOR Gate and the second operational amplifier, and configured to control whether to output the second amplified analog input signal according to the second control signal, wherein the first switch control outputs the second amplified analog input signal when the analog input signal is substantially greater than the first threshold voltage and smaller than a second threshold voltage;
   a second comparator, configured to output the third control signal according to the second threshold voltage and the analog input signal;
   a third operational amplifier, configured to amplify the analog input signal according to a third magnification to generate a third amplified analog input signal when the analog input signal is not smaller than the first threshold voltage and the analog input signal is not greater than the second threshold voltage; and
   a third switch, coupled to the second comparator and the third operational amplifier, configured to control whether to output the third amplified analog input signal according to the third control signal, wherein the third switch controls outputting the third amplified analog input signal when the analog input signal is substantially greater than the second threshold voltage.

2. The amplifying circuit of claim 1, wherein the first control signal corresponds to the first magnification, the second control signal corresponds to the second magnification, the third control signal corresponds to the third magnification, the first magnification corresponds to a first voltage level range, the second magnification corresponds to a second voltage level range, and the third magnification corresponds to a third voltage level range.

3. The amplifying circuit of claim 2, wherein a voltage level of the analog input signal is substantially 0-5 volts, a conversion voltage level of the analog to digital converter with multi-stage conversion range is substantially 0-1.2 volts, the first threshold voltage is substantially 0.5 volts, the second threshold voltage is substantially 1 volt, the first voltage level range is substantially 0-0.5 volts, the second voltage level range is substantially 0.5-1 volts, and the third voltage level range is substantially 1-5 volts.

4. The amplifying circuit of claim 2, wherein the first magnification is substantially greater than 1, the second magnification is substantially equal to 1, and the third magnification is substantially smaller than 1.

5. The amplifying circuit of claim 2, wherein the analog to digital converter with multi-stage conversion range comprises:
   a microcontroller, coupled to the amplifying circuit, and configured to perform analog to digital conversion to one of the first amplified analog input signal, the second amplified analog input signal and the third amplified analog input signal to generate an amplified digital code, and generate a digital output code according to the amplified digital code and one of the first magnification corresponding to the first control signal, the second magnification corresponding to the second control signal and the third magnification corresponding to the third control signal.

6. The amplifying circuit of claim 5, wherein, the microcontroller converts the amplified digital code into the digital output code according to a reciprocal of the first magnification when the first switch controls outputting the first amplified analog input signal; the microcontroller converts the amplified digital code into the digital output code according to a reciprocal of the second magnification when the second switch control output the second amplified analog input signal; and the microcontroller converts the amplified digital code into the digital output code according to a reciprocal of the third magnification when the third switch control output the third amplified analog input signal.

7. The amplifying circuit of claim 1, wherein:
   the first comparator comprises:
      a first positive input terminal, configured to receive the first threshold voltage;
      a first negative input terminal, configured to receive the analog input signal; and
      a first output terminal, configured to output the first control signal to the first switch;
   the NOR Gate comprises:
      a first input terminal, configured to receive the first control signal; a second input terminal, configured to receive the third control signal and; and
      a second output terminal, configured to output the second control signal to the second switch; and
   the second comparator comprises:
      a second positive input terminal, configured to receive the analog input signal;
      a second negative input terminal, configured to receive the second threshold voltage; and
      a third output terminal, configured to output the third control signal to the third switch.

8. An analog to digital converter with multi-stage conversion ranges, comprising:
   an amplifying circuit, comprising:
      a first comparator, configured to output a first control signal according to a first threshold voltage and an analog input signal;
      a first operational amplifier, configured to amplify the analog input signal according to a first magnification to generate a first amplified analog input signal when the analog input signal is smaller than the first threshold voltage;
      a first switch, coupled to the first comparator and the first operational amplifier, and configured to control whether to output the first amplified analog input signal according to the first control signal, wherein the first switch controls outputting the first amplified analog input signal when the analog input signal is substantially smaller than the first threshold voltage;

a NOR Gate, configured to generate a second control signal according to the first control signal and a third control signal;

a second operational amplifier, configured to amplify the analog input signal according to a second magnification to generate a second amplified analog input signal when the analog input signal is greater than the second threshold voltage;

a second switch, coupled to the NOR Gate and the second operational amplifier, and configured to control whether to output the second amplified analog input signal according to the second control signal, wherein the first switch controls outputting the second amplified analog input signal when the analog input signal is substantially greater than the first threshold voltage and smaller than a second threshold voltage;

a second comparator, configured to output the third control signal according to the second threshold voltage and the analog input signal;

a third operational amplifier, configured to amplify the analog input signal according to a third magnification to generate a third amplified analog input signal when the analog input signal is not smaller than the first threshold voltage and the analog input signal is not greater than the second threshold voltage; and a third switch, coupled to the second comparator and the third operational amplifier, and configured to control whether to output the third amplified analog input signal according to the third control signal, wherein the third switch controls outputting the third amplified analog input signal when the analog input signal is substantially greater than the second threshold voltage; and a microcontroller, coupled to the amplifying circuit, and configured to perform analog to digital conversion to one of the first amplified analog input signal, the second amplified analog input signal and the third amplified analog input signal to generate an amplified digital code, and generate a digital output code according to the amplified digital code and one of the first magnification corresponding to the first control signal, the second magnification corresponding to the second control signal and the third magnification corresponding to the third control signal.

9. The analog to digital converter of claim 8, wherein the first control signal corresponds to the first magnification, the second control signal corresponds to the second magnification, the third control signal corresponds to the third magnification, the first magnification corresponds to a first voltage level range, the second magnification corresponds to a second voltage level range, and the third magnification corresponds to a third voltage level range.

10. The analog to digital converter of claim 9, wherein a voltage level of the analog input signal is substantially 0-5 volts, a conversion voltage level of the analog to digital converter with multi-stage conversion range is substantially 0-1.2 volts, the first threshold voltage is substantially 0.5 volts, the second threshold voltage is substantially 1 volt, the first voltage level range is substantially 0-0.5 volts, the second voltage level range is substantially 0.5-1 volts, and the third voltage level range is substantially 1-5 volts.

11. The analog to digital converter of claim 9, wherein the first magnification is substantially greater than 1, the second magnification is substantially equal to 1, and the third magnification is substantially smaller than 1.

12. The analog to digital converter of claim 8, wherein the microcontroller converts the amplified digital code into the digital output code according to a reciprocal of the first magnification when the first switch controls outputting the first amplified analog input signal; the microcontroller converts the amplified digital code into the digital output code according to a reciprocal of the second magnification when the second switch control output the second amplified analog input signal; and the microcontroller converts the amplified digital code into the digital output code according to a reciprocal of the third magnification when the third switch control output the third amplified analog input signal.

13. The analog to digital converter of claim 8, wherein:
the first comparator comprises:
a first positive input terminal, configured to receive the first threshold voltage;
a first negative input terminal, configured to receive the analog input signal; and
a first output terminal, configured to output the first control signal to the first switch;
the NOR Gate comprises:
a first input terminal, configured to receive the first control signal; a second input terminal, configured to receive the third control signal and; and
a second output terminal, configured to output the second control signal to the second switch; and
the second comparator comprises:
a second positive input terminal, configured to receive the analog input signal;
a second negative input terminal, configured to receive the second threshold voltage; and
a third output terminal, configured to output the third control signal to the third switch.

14. A method of analog to digital conversion, for an analog to digital converter with multi-stage conversion ranges, comprising:
determining a magnification according to a plurality of control signals;
amplifying an analog input signal according to the magnification to generate an amplified analog input signal;
performing analog to digital conversion to the amplified analog input signal to generate an amplified digital code; and
generating an output digital code according to a reciprocal of the magnification and the amplified digital code;
wherein the analog signal is amplified by a first operational amplifier when the analog signal is smaller than a first threshold voltage;
wherein the analog signal is amplified by a second operational amplifier when the analog signal is greater than a second threshold voltage;
wherein the analog signal is amplified by a third operational amplifier when the analog signal is not smaller than the first threshold voltage and the analog input signal is not greater than the second threshold voltage.

15. The method of claim 14, wherein the plurality of control signal corresponds to a plurality of magnifications comprising a first magnification, a second magnification and a third magnification, wherein the first magnification corresponds to a first voltage level range, the second magnification corresponds to a second voltage level range, the third magnification corresponds to a third voltage level range.

16. The method of claim 15, wherein a voltage level of the analog input signal is substantially 0-5 volts, a conversion voltage level of the analog to digital converter with multi-stage conversion range is substantially 0-1.2 volts, the first threshold voltage is substantially 0.5 volts, the second threshold voltage is substantially 1 volt, the first voltage level range is substantially 0-0.5 volts, the second voltage level range is substantially 0.5-1 volts, and the third voltage level range is substantially 1-5 volts.

17. The method of claim 15, wherein the first magnification is substantially greater than 1, the second magnification is substantially equal to 1, and the third magnification is substantially smaller than 1.

* * * * *

UNITED STATES PATENT AND TRADEMARK OFFICE
CERTIFICATE OF CORRECTION

PATENT NO. : 10,044,361 B1  
APPLICATION NO. : 15/867664  
DATED : August 7, 2018  
INVENTOR(S) : Meng-Ru Tsai Page 1 of 1

It is certified that error appears in the above-identified patent and that said Letters Patent is hereby corrected as shown below:

On the Title Page

Item (73) correct the name of the assignee from "Winstron Corporation" to --Wistron Corporation--.

Signed and Sealed this  
Second Day of October, 2018

Andrei Iancu  
*Director of the United States Patent and Trademark Office*